United States Patent [19]

Erdeljac et al.

[11] Patent Number: 5,330,922

[45] Date of Patent: Jul. 19, 1994

[54] SEMICONDUCTOR PROCESS FOR MANUFACTURING SEMICONDUCTOR DEVICES WITH INCREASED OPERATING VOLTAGES

[75] Inventors: John P. Erdeljac, Plano; Louis N. Hutter, Richardson, both of Tex.

[73] Assignee: Texas Instruments Incorporated, Dallas, Tex.

[21] Appl. No.: 411,782

[22] Filed: Sep. 25, 1989

[51] Int. Cl.$^5$ .......................................... H01L 21/265
[52] U.S. Cl. ........................................ 437/30; 437/59; 148/DIG. 13
[58] Field of Search ............. 437/30, 59; 148/DIG. 9, 148/13; 357/43

[56] References Cited

U.S. PATENT DOCUMENTS

| 3,793,088 | 2/1974 | Edkton, Jr. ........................ 437/156 |
| 4,484,388 | 11/1984 | Iwasaki ............................... 437/59 |

FOREIGN PATENT DOCUMENTS

| 0013585 | 4/1980 | Japan ................................... 437/55 |
| 0056643 | 4/1980 | Japan ................................... 437/55 |
| 0154655 | 8/1985 | Japan ................................. 437/156 |
| 0067255 | 4/1986 | Japan ................................... 437/55 |

OTHER PUBLICATIONS

Lecture Notes, "BiCMOS Technology", A. R. Alvarez, Section 2, University of California, Berkeley.

Primary Examiner—Olik Chaudhuri
Assistant Examiner—Long Pham
Attorney, Agent, or Firm—W. James Brady, III; B. Peter Barndt; Richard L. Donaldson

[57] ABSTRACT

A method of manufacturing semiconductor devices with increased operating voltages is described. A dopant of a second conductivity type is implanted into a region of a first epitaxial layer of the first conductivity type to form a buried layer. A substantially smaller dosage of a faster-diffusing dopant of the second conductivity type is then implanted into the buried layer region. The second epitaxial layer of the first conductivity type is formed over the first epitaxial layer. A region of the second epitaxial layer overlying the doped region of the first epitaxial layer is implanted with a dopant of the second conductivity type and diffused to form a doped well. The faster-diffusing dopant diffuses upward to make good electrical contact with the doped well diffusing downward from the surface. The lateral diffusion of the faster-diffusing dopant can be contained, so that lateral spacing design rules do not have to be increased. A thicker second epitaxial layer can thus be used, resulting in increased operating voltage.

24 Claims, 9 Drawing Sheets

SEMICONDUCTOR PROCESS FOR MANUFACTURING SEMICONDUCTOR DEVICES WITH INCREASED OPERATING VOLTAGES

FIELD OF THE INVENTION

This invention relates to a process permitting increased operating voltages in BiCMOS and bipolar integrated circuits.

BACKGROUND OF THE INVENTION

A major trend in the electronic community is to scale to smaller sizes while integrating more functions onto a single integrated circuit. This demands a process that can offer both high performance analog and digital capabilities, e.g. a BiCMOS process. Some advantages of this process are increased performance, reduced system size and improved system reliability. One result of the trend to higher integration is that supply potentials must also decrease. However, in many analog applications, existing restraints force the supply potentials to remain at values greater than 5, 10 or 20 volts. In some cases the circuits may be required to withstand a bias of 30 volts or greater.

Another trend has been toward a system approach for circuit design and production in a BiCMOS process, in which a standard cell design approach has been adopted. The standard cell design approach allows subcircuits that have been characterized and placed in a library to be used in many designs.

The primary measure of the potential operating voltage of a bipolar NPN transistor is the breakdown voltage between the collector and the emitter with the base opened (BVceo). Typically it is this breakdown voltage that limits the operating voltage. In order to increase the operating voltage of the transistor and thereby the circuit, it becomes necessary to increase the NPN BVceo.

A typical technique for accomplishing this is to simply increase the epitaxial thickness in the bipolar process. Since the thickness of the epitaxial layer would increase, the operating voltage of the circuit would also increase in accordance with the relationship:

$$BVceo = \frac{BVcbo(\text{bulk})}{(hFE)^{1/n}}$$

Here, BVcbo (bulk) is the thickness-limited breakdown voltage between the N+ buried collector and the base with the emitter opened that occurs at the bottom of the base-collector junction. This portion of the collector-base junction is where the current flows in a vertical bipolar transistor. The planar breakdown is independent of the radius of curvature of the junction, and it is dependent on the epitaxial thickness. The hFE parameter is the common emitter current gain of the transistor, and n is an empirical parameter typically on the order of 3 to 6.

Figure 1A:
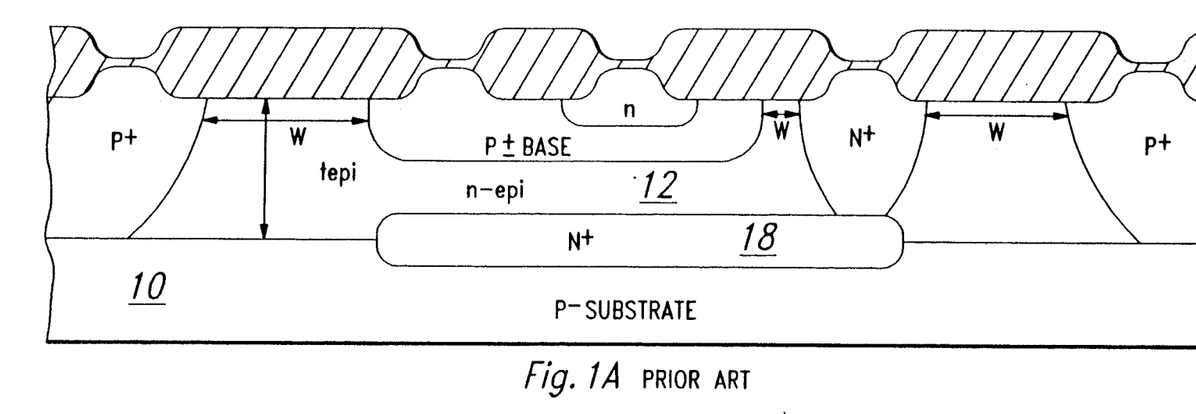
FIG. 1a shows a cross-section of a conventional buried collector bipolar device built using a prior art process.

The major disadvantage of increasing the n-type epitaxial thickness in a conventional standard buried collector bipolar process is that as the epitaxial thickness is increased, the p-type isolation must be diffused a greater distance. This also produces an increase in the lateral diffusion of the isolation region, thereby increasing lateral spacing design rules in terms of the distance between each diffusion to the isolation region. Thus, all transistor sizes would be scaled to larger dimensions, even those which do not need to operate to the higher voltage This is depicted in the attached FIGS. 1a and 1b. A conventional, junction-isolated standard buried collector NPN cross-section is shown in FIG. 1a. The arrow labeled tepi indicates the thickness of the epitaxial layer. The arrows labeled W indicate the distance between diffusion and isolation regions.

Figure 1B:
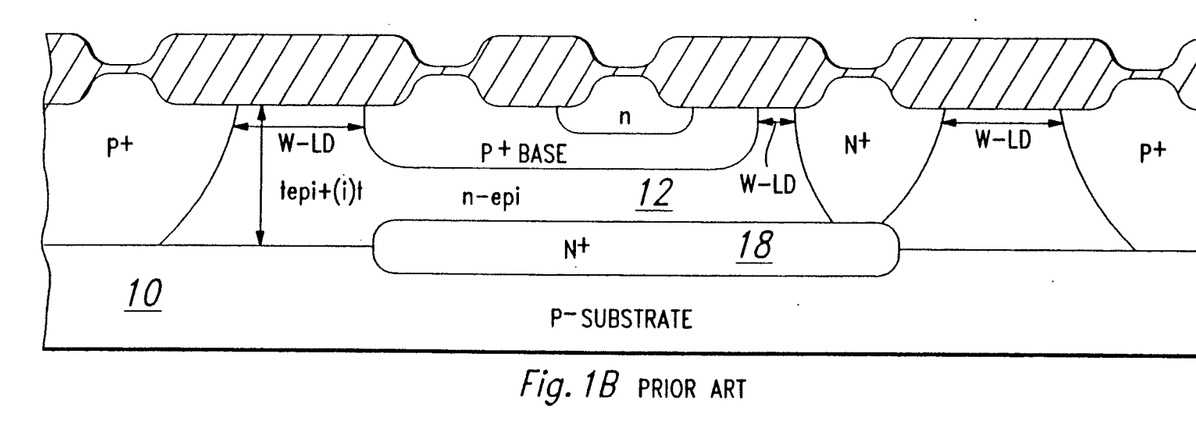
FIG. 1b shows the device of FIG. 1a with an increased epitaxial layer thickness and an increased P+ isolation diffusion.

FIG. 1b shows a standard buried collector NPN cross-section having an increased epitaxial layer thickness. In FIG. 1b, the arrow labeled tepi+(i) t indicates the thickness of the original epitaxial layer increased by an incremental amount (i) t. The arrows labeled W−ld indicate the distances between the diffusions and isolation regions. The ld term represents an increase in the lateral diffusion of the diffusions and isolation regions. As can be seen by comparing FIG. 1a to FIG. 1b, the lateral spacings between diffusions have been appreciably decreased. As a result, an increase in the lateral spacing design rules of the low voltage devices as well as the high voltage devices would be required, because of the decreased lateral spacing caused by increased lateral diffusion.

Another approach to increase BVceo, indicated by the above relationship, would be to decrease the hFE of the device. This is typically not a very practical solution, however, since the tradeoff between operating voltage and the gain of the device is not desirable due to the degraded performance of the transistor.

The BVceo of an NPN bipolar transistor could also be increased if the N+ buried layer were removed, or its doping level greatly reduced due to the increase in the thickness- limited BVcbo (bulk). However, high collector series resistance and reduced NPN performance would result.

Since bipolar-oriented BiCMOS processes suffer from poor packing densities due to the use of thicker epitaxial layers and the need for deep p+ isolation similar to that shown in FIG. 1b, many advanced BiCMOS processes are CMOS-oriented, where the CMOS process is Nwell-based (i.e. Nwell BiCMOS process). The Nwell BiCMOS process allows the NPN collector region to be self-isolating with the p-type epitaxial layer acting as the isolation region. Since Nwell CMOS processes are commonly used in analog and digital applications, this choice of starting process can minimize the amount of device recharacterization needed after merging bipolar components.

In order to increase the operating voltage of the bipolar transistors in an Nwell BiCMOS process, a similar approach could be taken, i.e. increasing the thickness of the epitaxial layer, resulting in a higher voltage Nwell BiCMOS process.

Figure 2A:
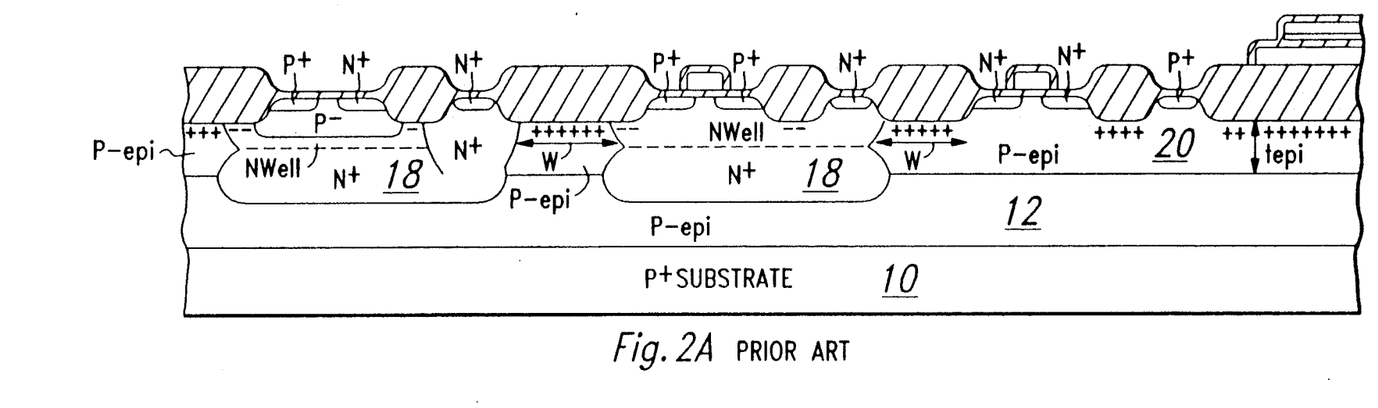
FIG. 2a shows a cross-section of devices built using a prior art BiCMOS process.
Figure 2B:
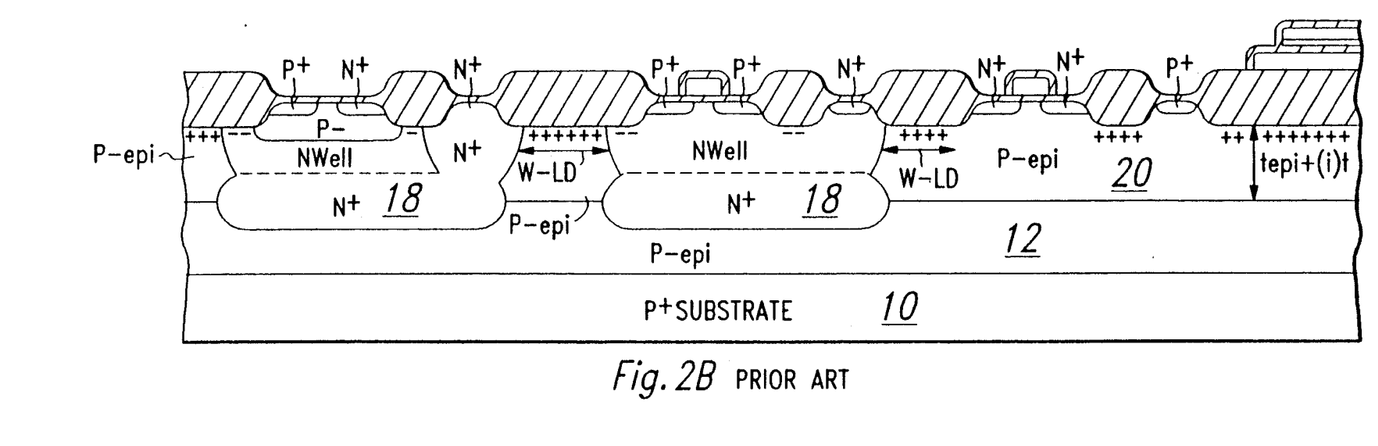
FIG. 2b shows the devices of FIG. 2a with an increased epitaxial layer thickness and an increased Nwell diffusion.

FIG. 2a shows a standard BiCMOS cross-section. FIG. 2b shows a standard BiCMOS cross-section with a thicker epitaxial layer.

As the epitaxial thickness is increased as shown in FIG. 2b, the Nwell must be driven deeper into the epitaxial layer in order to meet the N+ buried layer. Since the Nwells are used as the wells to house the vertical NPN transistor as well as the PMOS transistors, any alterations made to these regions would affect not only the bipolar devices, but also the CMOS devices. Additional heat cycling would be needed to insure that the up-diffusing N+ buried layer would meet the down-diffusing Nwell. As shown in FIG. 2b by the arrows labeled W-delta 1d, distances both between the Nwells and between the Nwells and adjacent devices are appreciably decreased due to the increased lateral diffusion of the Nwells. This would necessitate increased lateral spacing design rules even for the lower-voltage bipolar and CMOS components.

In a BiCMOS process where it is necessary to increase the voltage of the bipolar devices and yet remain compatible with the standard cell methodology, this would not be acceptable. The purpose of a standard cell methodology is to decrease design times and increase success. Therefore, a technique for obtaining higher-voltage operation must not impact the current low-voltage cells to maintain compatibility with a standard cell methodology.

In a standard bipolar process, there would come a point at which increasing the epitaxial thickness would no longer bring adequate returns in terms of increasing the operating voltage of the transistor. This is referred to as nonthickness-limited break-down between the base and collector. In this case, a conventional technique used to increase the operating voltage of an NPN transistor is to increase the epitaxial resistivity. An increase in resistivity, or decrease in doping level, reduces the slope of the electric field within the epitaxial layer, thereby increasing the BVcbo (bulk) of the device. However, reducing the doping level of the epitaxial layer lowers punch-through voltages within the silicon, necessitating increased distances between diffusions of the same type, leading to design rule increases. Furthermore, in a BiCMOS process the epitaxial layer is used in a different manner (i.e. it forms the isolation between adjacent devices), therefore, this approach would not produce the same result. In fact, increasing the p-type epitaxial resistivity in an Nwell BiCMOS process would act to increase the net Nwell doping level since the Nwell is formed by counter-doping the epitaxial layer with N-type impurities. Thus, this would produce a lower BVcbo (bulk). Nevertheless, if the epitaxial resistivity were changed, the basic BiCMOS devices would be affected making it a nonviable approach for standard cell design strategies.

SUMMARY OF THE INVENTION

There is presented a process for increasing the operating voltage of semiconductor devices built using BiCMOS processes. This is accomplished by increasing the thickness of the epitaxial layer, without changing the design rules or performance for the existing low-voltage sub-circuits, allowing these standard cells to be used in the higher voltage process.

The method includes forming a first step epitaxial layer of a first conductivity type on a semiconductor substrate of the first conductivity type;

doping a region of the first epitaxial layer with a dopant of a second conductivity type;

doping the region of the first epitaxial layer with a faster diffusing dopant of the second conductivity type;

forming a second epitaxial layer of the first conductivity type over the first epitaxial layer;

doping a region of the second epitaxial layer with a dopant of the second conductivity type, the region of the second epitaxial layer being in alignment with the doped region of the first epitaxial layer; and diffusing the dopants so that the doped region of the second epitaxial layer comes into electrical contact with the doped region of the first epitaxial layer.

The method may also include the additional step of forming devices in the doped regions.

The method may also include the process described above, wherein the step of doping the region of the first epitaxial layer with a fast-diffusing dopant further comprises:

doping a second region of the first epitaxial layer with a faster-diffusing dopant, wherein the second region lies within and has a smaller area than the region of the first epitaxial layer.

The step of doping a region of the first epitaxial layer may further comprise the steps of:

forming an oxide layer over the first epitaxial layer;

removing the oxide layer to form a window over the region to be doped;

implanting the region through the window with a dopant of a second conductivity type; and diffusing the dopant of the second conductivity type to form a heavily doped region.

There is also presented a method of increasing the thickness of an epitaxial layer in a semiconductor process, comprising the steps of:

forming a first epitaxial layer of a first conductivity type on a semiconductor substrate of a first conductivity type;

forming a first oxide layer over the first epitaxial layer;

selectively removing the first oxide layer from regions of the first epitaxial layer to expose regions of the first epitaxial layer;

implanting a dopant of a second conductivity type into the exposed regions of the first epitaxial layer;

diffusing the dopant;

partially deglazing the first oxide layer to expose the regions;

implanting the regions with a faster-diffusing dopant of the second conductivity type;

removing the first oxide layer;

forming a second epitaxial layer over the first epitaxial layer;

forming a second layer of oxide over the second epitaxial layer;

selectively removing the second oxide layer from regions of the epitaxial layer, the regions of the second epitaxial layer overlying the implanted regions of the first epitaxial layer;

implanting a dopant of a second conductivity type into the regions of the second epitaxial layer;

diffusing the dopant; and forming semiconductor devices in the regions.

The method may further comprise the step of diffusing the faster-diffusing dopant.

There is also presented a method for increasing the operating voltage of semiconductor devices built using BiCMOS processes.

The method includes doping a region of a semiconductor substrate of the first conductivity type with a dopant of a second conductivity type;

doping the region of the semiconductor substrate with a faster diffusing dopant of the second conductivity type;

forming an epitaxial layer of the first conductivity type over the semiconductor substrate;

doping a region of the epitaxial layer with a dopant of the second conductivity type, the region of the epitaxial layer being in alignment with the doped region of the semiconductor substrate; and diffusing the dopants so that the doped region of the epitaxial layer comes into electrical contact with the doped region of the semiconductor substrate.

BRIEF DESCRIPTION OF THE DRAWINGS

The present invention is illustrated in the attached drawings in which.

DETAILED DESCRIPTION OF THE PREFERRED EMBODIMENT

Figure 3:
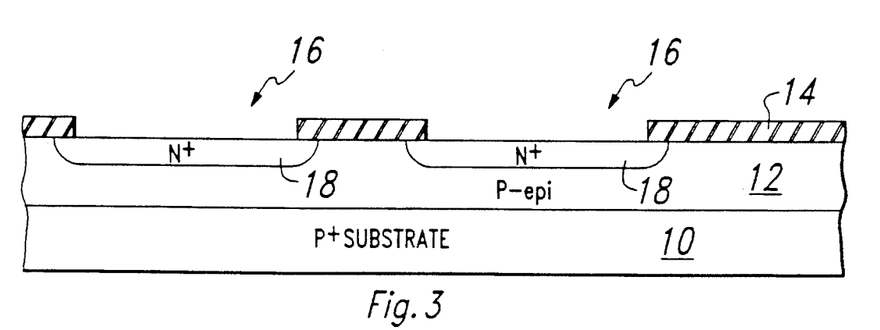
FIG. 3 shows a cross-section of a BiCMOS structure after a first processing stage of the present invention.

The preferred embodiment of the present invention is illustrated in FIGS. 3–6 attached hereto. FIG. 3 illustrates a semiconductor structure after a first processing stage embodying the present invention.

As shown in FIG. 3, an epitaxial layer 12 has been formed on a semiconductor substrate 10. The epitaxial layer 12 and substrate 10 are both of a first conductivity type. In the preferred embodiment, the substrate 10 is heavily doped p+ type silicon and the epitaxial layer 12 is of lightly doped p− type silicon. A layer of oxide 14 is then formed over the surface of the epitaxial layer 12. The oxide layer 14 is removed in a conventional manner from selected regions 16, in which heavily doped n+ buried layers will be formed.

The selected regions 16 are then implanted with a dopant of a second conductivity type. The dopants will preferably be arsenic or antimony. In the preferred embodiment, antimony is used with an implant dosage of $6 \times 10^{15}/cm^2$ at 60 Kev. A diffusion process is then performed, during which the second conductivity type dopants are diffused into the epitaxial layer 12, forming the heavily doped n+ regions 18 shown in FIG. 3. In the preferred embodiment, the dopant is diffused for 30 minutes at 1250° C.

A partial oxide etch is then performed, to remove oxide from the surface of the epitaxial layer 12 in regions 16. The oxide layer forms during the diffusion of the n+ buried layer 18.

As can be seen from FIG. 3, the edges of oxide layer 14 adjacent to regions 16 overlap the n+ regions 18. The amount of overlap is dependent on the process, but is typically equal to about 85% of the depth of the n+ buried layer 18.

A second dopant of the second conductivity type is then implanted in the epitaxial layer 12 in regions 16 to form a lightly doped region within the n+ buried layer 18. In the preferred embodiment, the dopant is a fast-diffusing type, such as phosphorus. The preferred implant dosage ranges from 2E13 to $6E13/cm^2$ at 150 KeV–30-0KeV. The oxide layer (14) is used to block the phosphorus from entering the silicon between adjacent buried layer regions.

Due to the n+ buried layer diffusion, the n+ buried layer 18 has already diffused laterally. Therefore, the n− implant (phosphorus) will be inside the existing lateral junction of the n+ buried layer 18 with the field oxide 14 used as an implant block. If the amount of overlap of the n+ buried layer 18 with respect to the n− buried layer needs to be increased, or better control is desired, the partial oxide etch could be a masking level with the oxide removal internal to the original selected regions 16. As an alternative, sidewalls (not shown) could be formed on the edges of oxide layer 14 surrounding selected regions 16. This would decrease the size of the regions 16 into which the fast-diffusing dopant is implanted, thereby further containing its lateral diffusion within that of the n+ buried layer region 18.

In an alternative implementation of the present invention, the epitaxial layer 12 may be eliminated, and the implantation of the dopant of a second conductivity type and the implantation of the fast diffusing type dopant of the second conductivity type may be implanted directly into the semiconductor substrate 10. This is done by eliminating the step of forming the epitaxial layer 12 on the semiconductor substrate 10.

An optional diffusion after the fast-diffusing dopant has been implanted can be incorporated to reduce the sensitivity to the HCl silicon etch which is typically performed prior to the epitaxial deposition in the standard BiCMOS process. The optional diffusion step would drive the fast-diffusing dopant far enough below the surface of the epitaxial layer 12 so that the HCl silicon etch would not remove excessive amounts of the fast-diffusing dopant.

Figure 4:
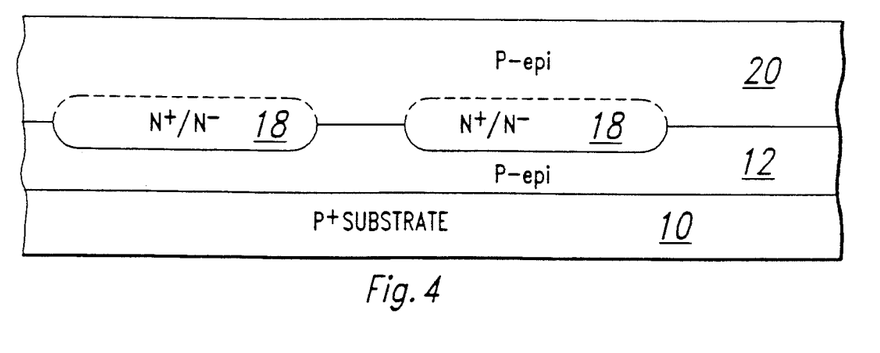
FIG. 4 shows the BiCMOS structures of FIG. 3 after a second processing stage of the present invention.

The oxide layer 14 is then stripped, and a second epitaxial layer 20 of the first conductivity type, in the preferred embodiment a lightly doped p− material, is then formed, preferably by deposition, over the surface of first epitaxial layer 12. FIG. 4 shows a cross-section of the structure after the deposition of the second epitaxial layer 20.

Figure 5:
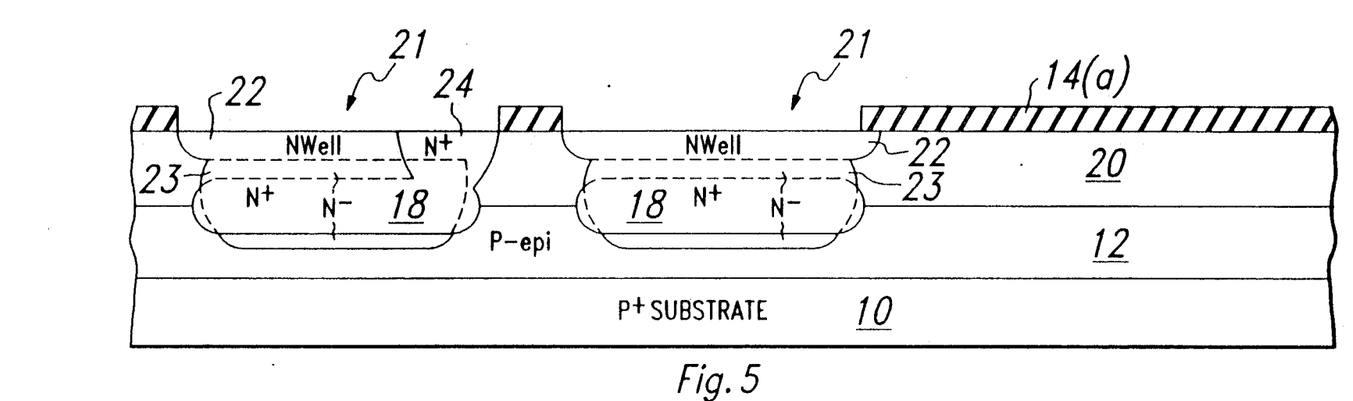
FIG. 5 shows the BiCMOS structure of FIG. 3 after a third processing stage of the present invention.

A second oxide layer 14(a) is then formed over the surface of the second epitaxial layer 20. As shown in FIG. 5 the second oxide layer is removed in selected regions 21 which define areas in which the Nwells will be formed. The selected regions 21 are aligned with the n+/n− buried layers 18.

A dopant of the second conductivity type, preferably phosphorus is then implanted into the second epitaxial layer 20 in selected regions 21 and then diffused to form Nwells 22. As can be seen in FIG. 5, during the Nwell 22 diffusion, the fast-diffusing dopant up-diffuses from buried layer 18 while the Nwell 22 dopant is down-diffusing, with the resultant contour shown in FIG. 5. The regions labeled 23 represent regions into which the fast-diffusing dopant (phosphorus) has up-diffused past that of the n+ dopant (antimony). As can be seen, this ensures that the Nwell 22 is in electrical contact with the n+/n− deep buried layer 18.

In the preferred embodiment, the implant dosage of the Nwell 22 is 3.2E12 to 4.1E12 at 150 KeV. The dopant is diffused for 860 minutes at 1150° C.

Figure 6:
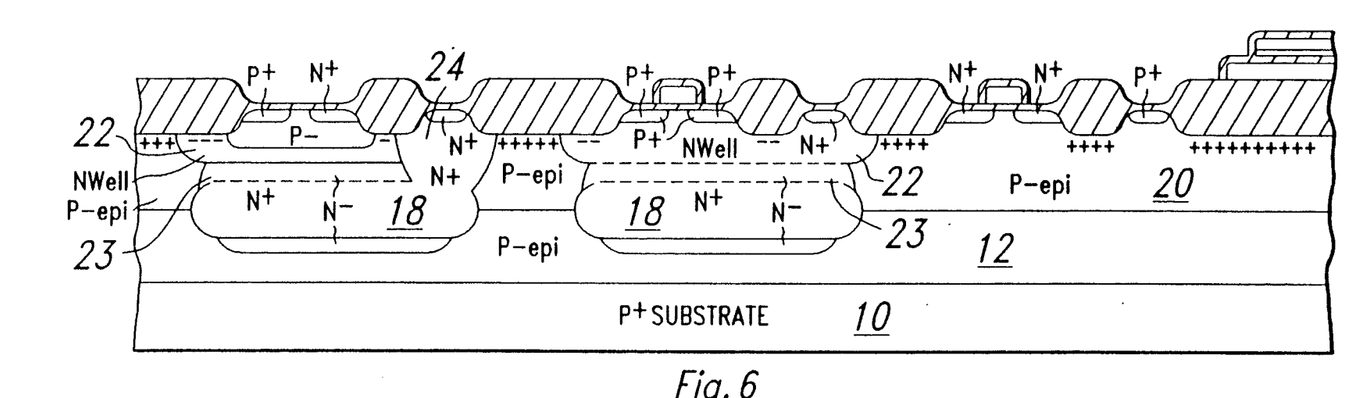
FIG. 6 shows the BiCMOS structure of FIG. 3 after a further processing stage of the present invention.

When the diffusion of Nwell 22 has been completed, a next selective oxide removal is performed to open windows to form deep n+ collector diffusions 24. A dopant of the second conductivity type is implanted through the windows and diffused, with the resulting cross-section as illustrated in FIGS. 5 and 6.

The oxide layer is then stripped from the surface of the epitaxial layer 20, and bipolar and CMOS structures are built using standard process steps which are not discussed in detail here. The resultant structure which includes a vertical NPN transistor, a PMOS transistor and an NMOS transistor is shown in FIG. 6.

It is the up-diffusion of the fast-diffusing dopant from the buried layers 18 into the second epitaxial layer 20 which allows an increase in epitaxial thickness without a corresponding unacceptable increase in lateral diffusion.

As discussed above, the lateral diffusion of the fast-diffusing dopant can be kept within the boundaries of the n+ buried layer diffusion by adjusting the size of the regions 16 into which the fast-diffusing dopant is implanted.

The overall result is increased vertical diffusion (resulting from up diffusion of fast-diffusing dopant from the buried layer) without any increase in lateral diffusion over a standard prior art BiCMOS process.

The process of the instant invention allows an increase in the epitaxial thickness from approximately 8.5 microns to 11.0 microns with resistivity remaining approximately 7.0 ohm-cm.

The Nwell diffusion for the process of the instant invention can be exactly the same as for a standard prior art lower voltage process. Likewise, the P-type epitaxial doping can be exactly the same as for the standard prior art lower voltage process. Thus, the CMOS devices are unaffected and the NPN transistor has a higher breakdown voltage without changing any of the lower voltage process steps.

Figure 7:
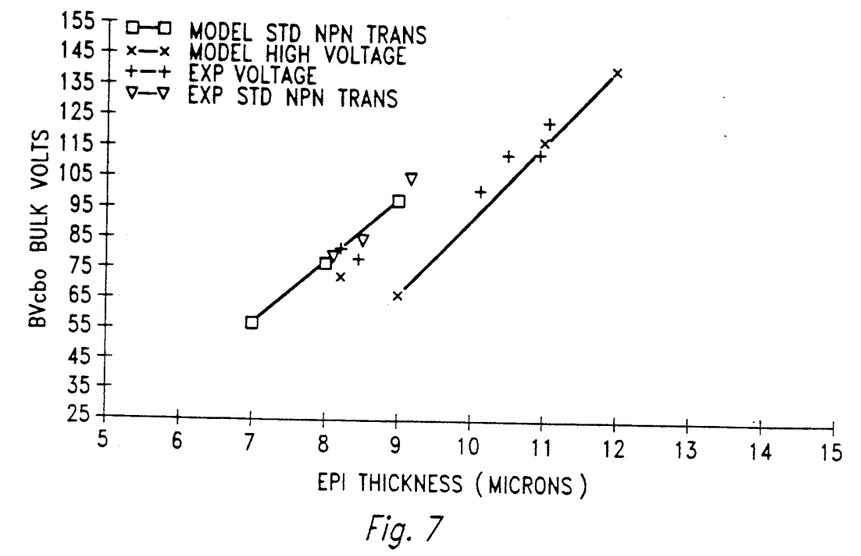
FIG. 7 is a graph showing BVcbo (bulk) versus epitaxial thickness for prior art processed devices and devices processed according to the present invention.

FIG. 7 illustrates data arising from model and experimental data comparing a standard NPN transistor and an NPN transistor made using the process of the instant invention. As can be seen from the graph, the line 26 representing BVcbo (bulk) versus epi thickness for a standard NPN transistor has a high BVcbo (bulk) value of approximately 100 volts with a maximum epitaxial thickness of 9 microns. Line 28 represents the results with a transistor made utilizing the present invention. A high BVcbo (bulk) of approximately 140 volts with a maximum epitaxial thickness of approximately 12 microns was obtained. Thus, it can be seen that there is a substantial increase in BVcbo (bulk) due to the increase in the thickness of the epitaxial layer of the structure formed in accordance with the present invention.

Figure 8:
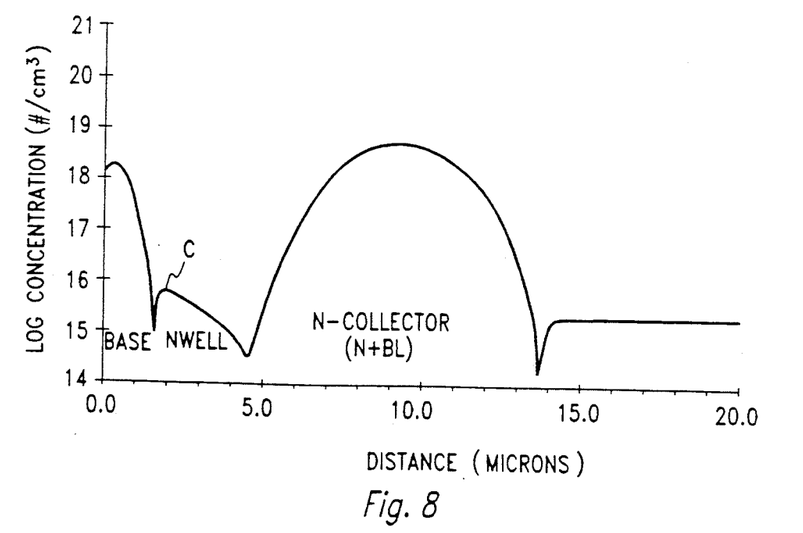
FIG. 8 is a graph showing the net Nwell, N buried layer and base doping profiles for a prior art BiCMOS process.

FIG. 8 shows various doping profiles for a standard BiCMOS process. In FIG. 8, the area of the curve lying between 1.5 and 5.0 on the distance scale is the area of concern when the thickness of the epitaxial layer is increased. The portion of the curve labeled A in FIG. 8 graphically represents the dopant concentration between the surface of the Nwell and the n+ buried layer. At point B, approximately 4.5 microns from the surface of the Nwell, the dopant concentration at the Nwell buried layer interface (which represents the concentration where the Nwell and buried layer are in electrical contact) shows a marked decrease over the point marked C, which is near the surface of the Nwell.

As the distance from the surface of the Nwell to the buried layer increases the dopant concentration at the Nwell buried layer interface decreases, (the point on the curve labeled B) and at some point the dopant concentration becomes so low that effective electrical contact between the Nwell region and the n+ buried layer region is lost, resulting in a device with degraded performance.

Figure 9:
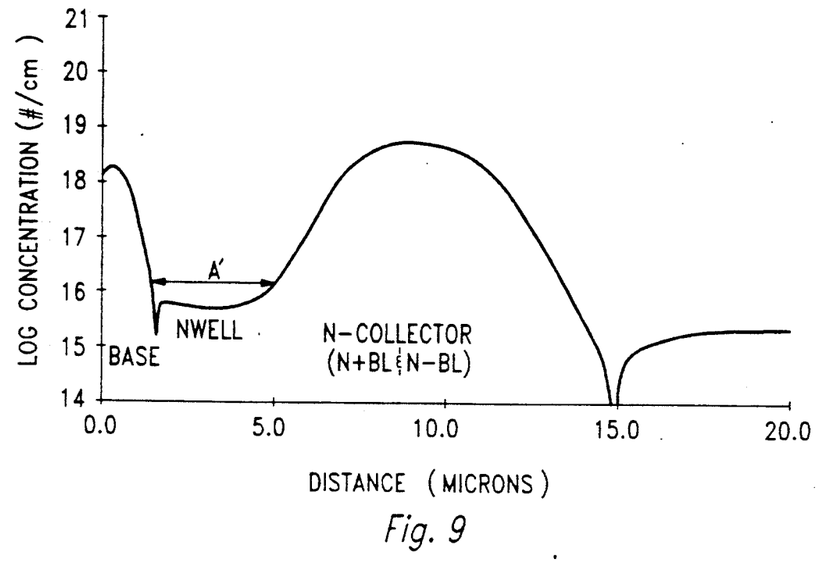
FIG. 9 is a graph showing the net Nwell, N buried layer and base doping profiles for the process embodying the present invention.
Figure 10:
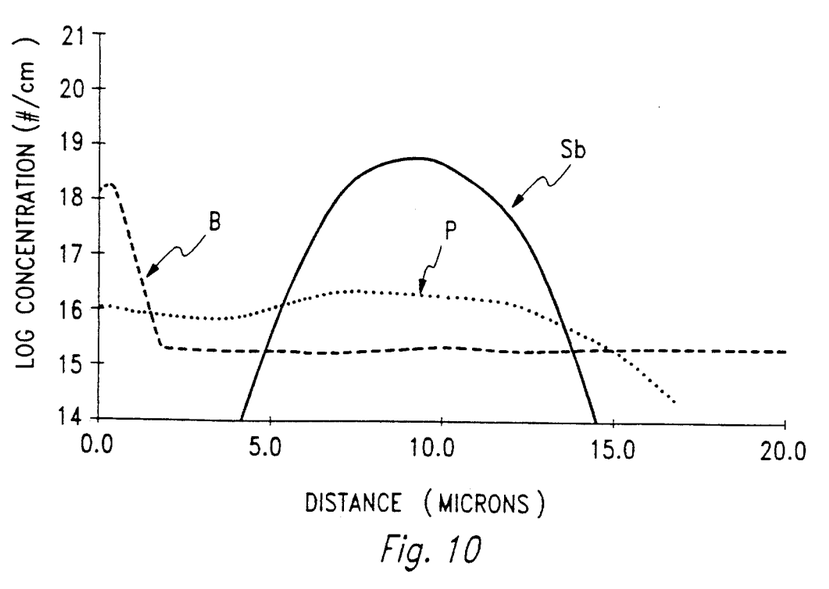
FIG. 10 is a graph showing the individual Nwell, N buried layer and base doping profiles of the process embodying the present invention.

FIGS. 9 and 10 show essentially the same information for a device made with the double-diffused method of the present invention, with FIG. 9 representing a composite dopant curve and FIG. 10 representing the contributions of the individual dopants to the overall dopant curve.

The region of the curve of FIG. 9 labeled A' is comparable to the region labeled A in FIG. 8. The portion of the curve labeled A', in FIG. 9, is approximately horizontal, indicating almost no decrease in the n-type dopant concentration levels between the bottom of the base and the n+ buried layer. As can be seen from comparing FIG. 9 and FIG. 10, this uniformity in dopant level can be attributed to the fast-diffusing phosphorus dopant, the concentration of which is shown in FIG. 10 by the line labeled P. As shown in FIG. 10, the dopant level of the phosphorus is almost uniform up to a distance of approximately 13 microns.

The curve labelled "Sb" in FIG. 10 represents the dopant concentration from the heavy buried layer implant of antimony. The curve labelled "B" represents the dopant concentration due to boron doping during epitaxial deposition and the base implant.

It is the addition of the phosphorus dopant which eliminates the reduction in dopant concentration at the Nwell/buried layer interface as the thickness of the epitaxial layer is increased.

Figure 11:
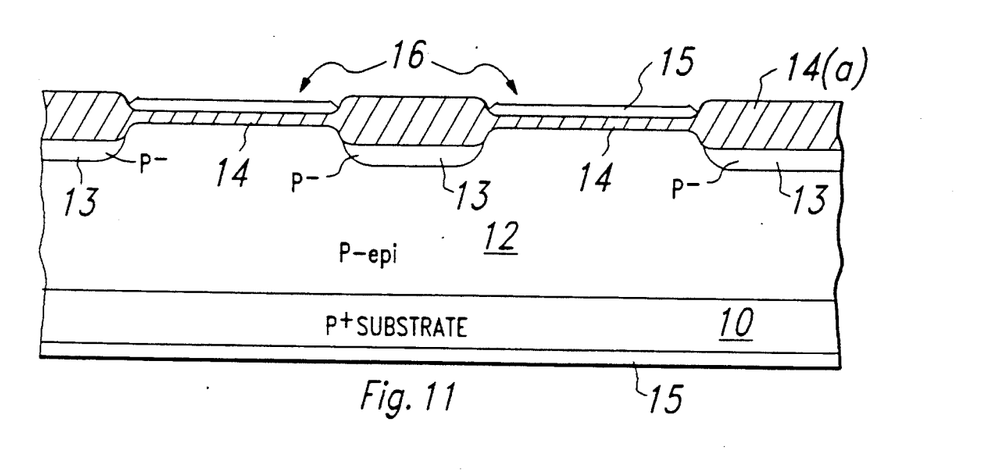
FIG. 11 shows a cross-section of a BiCMOS structure after a first processing stage of an alternative embodiment of the present invention.
Figure 12:
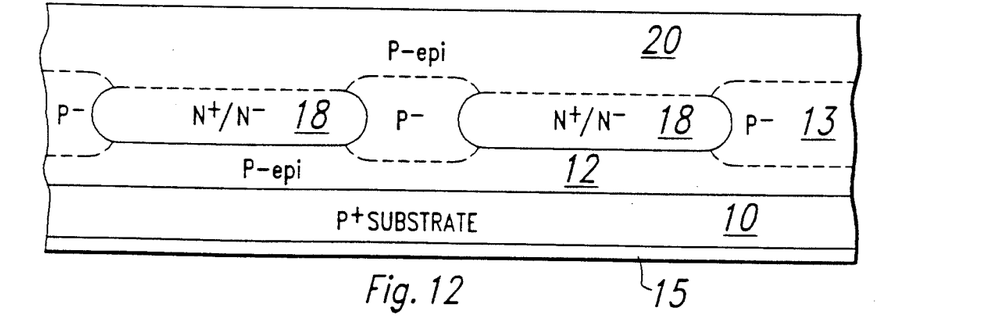
FIG. 12 shows the cross-section of the BiCMOS structure of FIG. 11 after a second processing stage.
Figure 13:
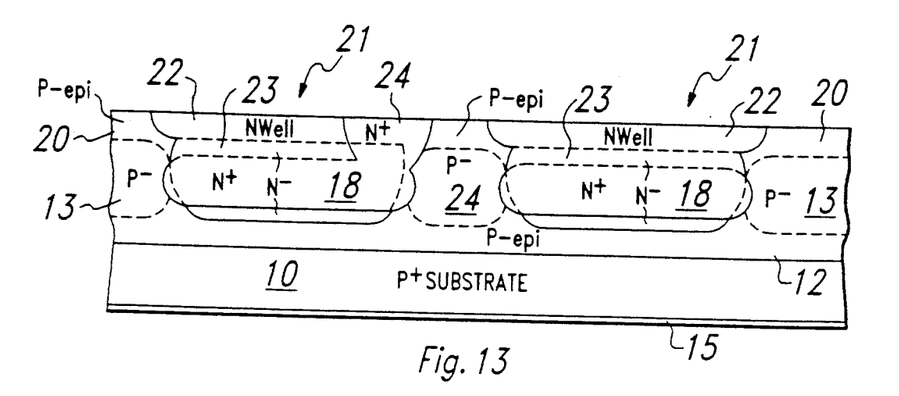
FIG. 13 shows the cross-section of the BiCMOS structure of FIG. 11 after a third processing stage.

An alternative embodiment of the present invention is illustrated in FIGS. 11, 12 and 13. Referring to FIG. 11, a p− epitaxial layer 12 is formed on the surface of a p+ substrate 10. A first oxide layer 14 is then formed on the surface of the epitaxial layer 12. A nitride layer 15 is then deposited on the surface of the oxide layer 14, preferably using a low pressure chemical vapor deposition process. The nitride layer 15 is then partially removed, leaving the nitride layer over selected regions 16 beneath which Nwells will later be formed. The nitride layer 15 can be selectively removed utilizing a photoresist mask and a plasma etching process. As can be seen from FIG. 11, a layer of nitride 15 is also formed on the back side of the wafer as well as the surface of the oxide layer 14 during the nitride deposition.

A dopant (preferably boron) is then implanted through the oxide layer 14 and diffused forming lightly doped p— buried layers 13. The nitride layer 15 and the photoresist (not shown) prevent the dopant from penetrating into regions 16. During this diffusion, a blocking oxide 14a is grown over those regions not protected by the nitride. FIG. 11 shows a cross-section of the structure after the p— diffusion step.

Once the p— buried layers 13 have been diffused, the remaining nitride layer 15 is removed. The nitride layer 15 can be removed using either a wet or dry etching process. If a dry etching process is used, the nitride layer 15 can be removed from the oxide layer 14, but may remain on the back of the wafer. As is discussed below, there are advantages to leaving the nitride layer 15 on the backside of the wafer.

Once the nitride layer 15 is removed, the oxide layer 14 is removed from region 16 by a partial etching process, while the majority of the blocking oxide 14a remains. A dopant, preferably arsenic or antimony is then implanted into regions 16 and diffused, forming heavily doped n+ regions 18. A second oxide etching process partially removes the oxide layer (not shown) from regions 16 formed during the n+ diffusion, exposing the surface of the first epitaxial layer 12 in the regions 16. Again, the majority of the blocking oxide remains.

A fast-diffusing dopant, preferably phosphorus, is implanted through regions 16 into regions 18 and diffused. The blocking oxide 14a prevents the phosphorus from entering the silicon between the buried layer regions. The remaining blocking oxide layer 14a is then stripped, and a second p— epitaxial layer 20 is formed on the surface of the first epitaxial layer 12. FIG. 12 shows a cross-section of the structure after the second epitaxial layer 20 has been formed.

The nitride layer 15 shown in FIG. 12 prevents any contamination of the backside of the wafer during the deposition of the second epitaxial layer 20. If the nitride layer 15 is not present on the backside of the wafer, outgassing of boron from the p+ substrate can occur during the deposition of the second epitaxial layer 20, causing a p— layer to form on the front side of the wafer.

This unwanted p— layer can counter-dope the up-diffusing and down-diffusing n— regions, resulting in an electrical disconnection between them.

A second oxide layer (not shown) is then formed on the surface of the second epitaxial layer 20. The second oxide layer is selectively removed from the regions 21, which are aligned with regions 16 in the first epitaxial layer (the n+/n— buried layer 18). A dopant, preferably phosphorus, is then implanted into regions 21 and diffused, forming Nwells 22.

As can be seen from FIG. 13, n— regions 23 are formed by up-diffusion of the fast-diffusing dopant from the buried layer 18. The up-diffusion from buried layer 18 combined with the down-diffusion of the n type Nwell dopant insures good electrical contact between the Nwell 22 and the buried layer 18. The oxide layer (not shown) is then selectively removed and an n+ collector diffusion performed with the resulting n+ collector region 24 being formed. The oxide layer is then stripped, leaving the structure shown in the cross-section of FIG. 13. As shown in FIG. 13, the p— isolation regions 13 provide increased electrical isolation between adjacent n+ buried layers 18. The desired bipolar and CMOS structures are then formed in the Nwells 22 using standard prior art process steps.

A comparison of FIG. 13 with FIG. 5 shows that the structures are identical, except for the addition of the p— isolation regions 13 between all the n buried layers. The addition of the isolation regions 13 implant allows the epitaxial thickness to be increased more than is possible without the implant, further increasing the BVcbo (bulk). For example, if the isolation region implant is not performed an epitaxial thickness is reached at which region 23 (the upward extension of the buried layer due to the fast-diffusing phosphorus n— buried layer) no longer contacts the Nwell 22. In order to increase the n— buried layer up-diffusion to allow for thicker epitaxial layers, an increase in the n— buried layer implant is necessary. However, as the total doping level of the n— buried layer increases, the lateral diffusion increases, lowering the punch-through voltage between adjacent buried layer regions. The punch-through problem can be alleviated by the addition of the self-aligned p— isolation region illustrated in FIG. 13.

Consideration must also be given to the p— isolation region implant dose used, since if this doping level is too high, avalanche breakdown between the p— isolation region and the buried layer regions 18 may limit operating voltage of the process. In addition, if the surface concentration of the phosphorus n— buried layer is too high, outgassing of the phosphorus could occur and counterdope the p— type epitaxial layer. The counterdoping can be eliminated by using a reduced pressure epitaxial deposition process.

Therefore, due to the fact that the epitaxial thickness may be increased, the operating voltage of the bipolar devices will also be increased. Since the increase was obtained by adding phosphorus implant and a boron implant and not by heat cycling, the CMOS circuit is not affected by the modification. In addition, since the modification is modular, it can simply be inserted into the original BiCMOS flow without any modifications to the process steps not pertaining to the higher voltage components. From a design point of view, the proposed process does not inhibit or disturb the use of a standard cell approach.

Figure 14:
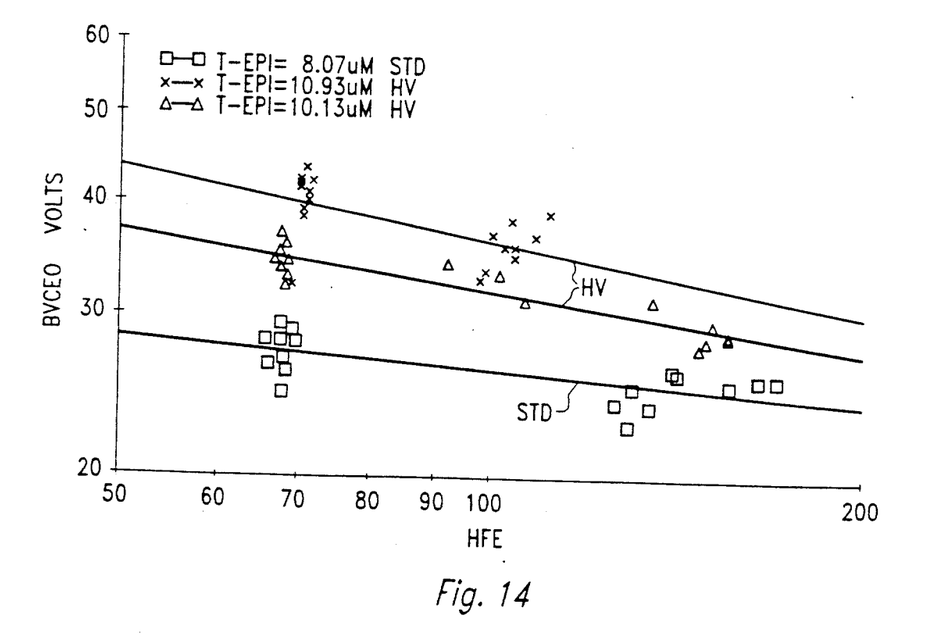
FIG. 14 is a graph showing BVceo versus hFE for a prior art BiCMOS process and a process embodying the present invention.

FIG. 14 represents experimental data from wafers processed using a standard Nwell BiCMOS process and a standard Nwell BiCMOS process with the proposed higher voltage extension provided by use of the present invention. FIG. 14 graphically depicts the previous equation relating BVceo to BVcbo (bulk) and hFE. The line labeled STD represents the results for the standard process, and the lines labeled HV represent the results for the process of the present invention.

As can be seen in the standard process, as the hFE decreases for a given epitaxial thickness, the BVceo increases slightly. However, significant increases in BVceo do not result, and the device performance is reduced. By contrast, with the thicker epitaxial layers made possible by the present invention, much more significant increases in BVceo can be realized without impacting device performance.

In addition to increasing the operating voltage of the bipolar NPN transistor, the process of the present invention can also impact the operating voltage of an isolated NMOS transistor. In a Nwell BiCMOS process, a conventionally-constructed (i.e. non-isolated) NMOS device would have its backgate electrically connected to the p− type substrate, which is normally biased to ground potential for digital circuits. These non-isolated devices would experience an undesirable shift in their threshold voltage if the substrate is biased to a negative potential, a common occurrence for analog circuits. Thus, the NMOS transistor is processed in an isolated p− epi tank. The isolation is constructed from the n− type buried layer along with an annular Nwell or deep n+ collector diffusion. By increasing the thickness of the epitaxial layer in which the NMOS device is built, the distance between the source/drain to the n+ buried layer is increased. Therefore, the amount of voltage that can be dropped between the source/drain of the device to the n+ isolation can be increased. This allows the isolated NMOS device to function to higher voltages.

Figure 15:
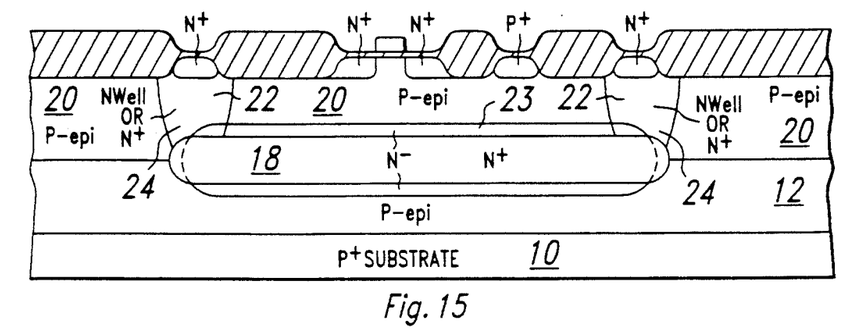
FIG. 15 shows a cross-section of an isolated NMOS device using a method embodying the present invention.

A cross-section of such a structure is shown in FIG. 15. To build the structure shown in FIG. 15, once the n+ buried layer 18 has been implanted and diffused, the oxide over the n+ buried layer 18 is removed and a fast-diffusing donor species is implanted. When the Nwell 22 or deep n+ collector diffusions 24 are formed, the fast-diffusing donor species implanted in the n+ buried layer 18 up-diffuses, ensuring good electrical contact between the Nwell 22 or deep n+ diffusions 24 and the buried layer 18. It should be noted that while the epitaxial thickness has been increased, the up-diffusion of the buried-layer extension 23 can offset most of this gain.

Figure 16:
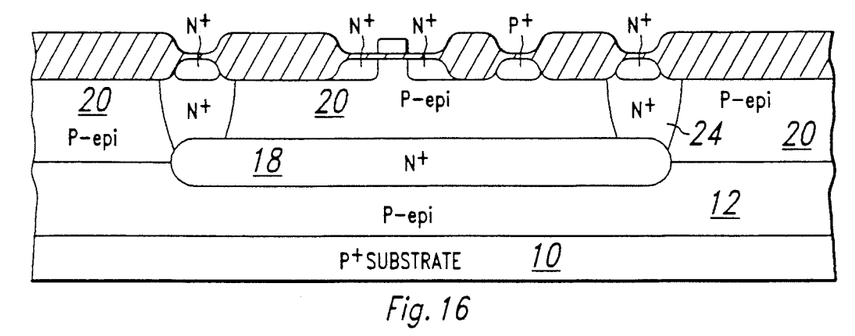
FIG. 16 is a cross-section of an isolated NMOS device using an alternative embodiment of the present invention.

FIG. 16 shows the cross-section of an isolated NMOS device formed using a process embodying the present invention with an additional masking step. To build the structure shown in FIG. 16, the region into which the n+ buried layer 18 is implanted and diffused would be masked prior to the implantation of the fast-diffusing dopant. Masking the n+ buried layer 18 prior to implantation of the fast-diffusing dopant eliminates the additional up− diffusion of the buried layer extension 23 in the selected regions of a circuit, producing an increase in the actual p− layer 20 separating the n+ buried layer 18 from surface devices as shown in FIG. 16.

It is important to note that the sidewall isolation of this type of device would have to be the deep n+ isolation used to reduce series resistance in bipolar transistors.

Figure 17:
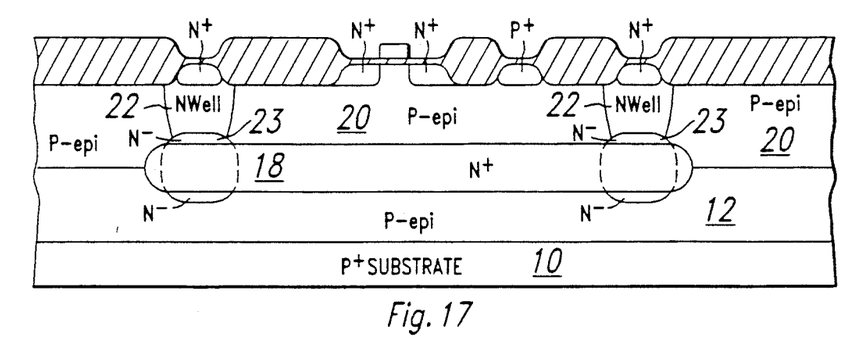
FIG. 17 shows a cross-section of an isolated NMOS device using a method embodying the present invention with isolation provided by an N− buried layer and an Nwell diffusion.

As an alternative, the structure of FIG. 17 can be formed using an alternative masking level after the n+ buried layer 18 has been formed. In this case, the n+ buried layer region would be masked prior to the implantation of the fast-diffusing dopant, so that an annular pattern is formed as shown in FIG. 17. When the Nwell 22 is formed, the fast-diffusing dopant would up-diffuse, ensuring good electrical contact with the Nwell 22, as shown in FIG. 17. This technique would eliminate the buried layer extension 23 between the Nwells 22 shown in FIG. 15, where the n+ buried layer regions were masked.

It can be seen that there has thus been provided a method of increasing BVceo of a bipolar NPN device by increasing the thickness of the epitaxial layer, thereby increasing BVcbo (bulk). The process disclosed need not substantially change the standard processing steps, and more importantly, need not change design rules, thus allowing standard cell design methodology to be used. This is achieved in a preferred embodiment by double-doping of an n buried layer, with the second dopant being a faster-diffusing dopant.

Although the invention has been described with respect to a specific preferred embodiment thereof, many variations and modifications will become apparent to those skilled in the art. It is therefore the intention that the appended claims be interpreted as broadly as possible in view of the prior art to include all such variations and modifications.

We claim:

1. A method of manufacturing a semiconductor device, comprising the steps of:
   forming a first epitaxial layer of a first conductivity type on a semiconductor substrate of the first conductivity type;
   doping a region of the first epitaxial layer with a dopant of a second conductivity type;
   doping the region of the first epitaxial layer with a faster-diffusing dopant of the second conductivity type;
   forming a second epitaxial layer of the first conductivity type over the first epitaxial layer;
   doping a region of the second epitaxial layer with a dopant of the second conductivity type, the region of the second epitaxial layer being in alignment with the region of the first epitaxial layer; and
   diffusing the dopants so that the doped region of the second epitaxial layer becomes in electrical contact with the doped region of the first epitaxial layer.

2. The method of claim 1, further comprising:
   forming a device having a region of the first conductivity type, the region of the first conductivity type being formed in the doped regions.

3. The method of claim 1, further comprising the step of:
   forming devices in the doped regions.

4. The method of claim 1, further comprising after the step of doping with a fast-diffusing dopant the step of:
   diffusing the fast-diffusing dopant.

5. The method of claim 1, wherein the faster-diffusing dopant is phosphorus.

6. The method of claim 1, wherein the step of doping the region of the first epitaxial layer with a faster-diffusing dopant further comprises:
   doping a second region of the first epitaxial layer with a faster diffusing dopant, wherein the second region lies within and has a smaller area than the region of the first epitaxial layer.

7. The method of claim 6, further comprising: forming the second region by forming sidewalls around the region of the first epitaxial layer.

8. The method of claim 1, wherein the step of doping a region of the first epitaxial layer further comprises the steps of:
   forming an oxide layer over the first epitaxial layer;
   removing the oxide layer to form a window over the region to be doped;
   implanting the region with a dopant of a second conductivity type through the window; and
   diffusing the dopant of the second conductivity type to form a heavily doped region.

9. The method of claim 1, wherein the step of doping the region with a faster-diffusing donor species of the second conductivity type further comprises the steps of:
   partially deglazing the oxide layer over the regions to expose the doped region of the epitaxial layer; and
   implanting the region with a fast-diffusing dopant of the second conductivity type.

10. The method of claim 9, further comprising the additional step of;

diffusing the faster-diffusing dopant.

11. A method of increasing the thickness of an epitaxial layer in a semiconductor process, comprising the steps of:
 forming a first epitaxial layer of a first conductivity type on a semiconductor substrate of a first conductivity type;
 forming a first oxide layer over the first epitaxial layer;
 selectively removing the first oxide layer from regions of the first epitaxial layer to expose regions of the first epitaxial layer;
 implanting a dopant of a second conductivity type into the exposed regions of the first epitaxial layer;
 diffusing the dopant:
 partially deglazing the first oxide layer to expose the regions;
 implanting the regions with a faster-diffusing dopant of the second conductivity type;
 removing the first oxide layer;
 forming a second epitaxial layer over the first epitaxial layer;
 forming a second layer of oxide over the second epitaxial layer;
 selectively removing the second oxide layer from regions of the second epitaxial layer, the regions of the second epitaxial layer overlying the implanted regions of the first epitaxial layer;
 implanting a dopant of the second conductivity type into the regions of the second epitaxial layer;
 diffusing the dopant; and
 forming semiconductor devices in the regions.

12. The method of claim 11, further comprising after the step of implanting the faster-diffusing dopant the additional step of:
 diffusing the faster-diffusing dopant.

13. The method of claim 11, wherein the faster-diffusing dopant is phosphorus.

14. A method of increasing the thickness of an epitaxial layer in a semiconductor process, comprising the steps of:
 forming a first epitaxial layer of a first conductivity type over a semiconductor substrate of the first conductivity type;
 forming a first oxide layer over the epitaxial layer,
 forming a nitride layer over the first oxide layer;
 selectively removing the nitride layer from the epitaxial layer, leaving nitride over selected regions of the first epitaxial layer;
 doping the epitaxial layer between the selected regions with a dopant of the first conductivity type;
 removing the nitride layer from over the selected regions;
 doping the selected regions with a dopant of the second conductivity type;
 doping the selected regions with a faster-diffusing dopant of the second conductivity type;
 forming a second epitaxial layer of the first conductivity type over the first epitaxial layer;
 forming a second oxide layer over the areas between selected regions of the second epitaxial layer, the selected regions of the second epitaxial layer overlying the selected regions of the first epitaxial layer;
 doping the selected regions of the second epitaxial layer with a dopant of the second conductivity type; and
 forming semiconductor devices in the selected regions.

15. The method of claim 14, wherein the faster-diffusing dopant is phosphorus.

16. The method of claim 14, wherein the step of removing the nitride layer from over the selected regions is done by a dry etch process.

17. The method of claim 14, wherein the step of removing the nitride layer is done by a wet etch process.

18. A method of increasing the operating voltage in devices formed by a semiconductor process, comprising the steps of:
 forming a first epitaxial layer of a first conductivity type on a semiconductor substrate of the first conductivity type;
 forming a first oxide layer on the surface of the first epitaxial layer;
 removing the first oxide layer from a selected region of the first epitaxial layer;
 implanting the selected region with a first dopant of a second conductivity type;
 diffusing the first dopant;
 removing the oxide formed during the diffusion of the first dopant from the selected region;
 implanting a faster-diffusing dopant of the second conductivity type into the selected region;
 removing the first oxide layer from the first epitaxial layer;
 forming a second epitaxial layer of the first conductivity type on the surface of the first epitaxial layer;
 forming a second oxide layer on the surface of the second epitaxial layer;
 removing the second oxide layer from a selected region of the second epitaxial layer, the selected region of the second epitaxial layer being aligned with the selected region of the first epitaxial layer;
 implanting the selected region of the second epitaxial layer with a second dopant of the second conductivity type;
 diffusing the second dopant;
 removing the second oxide layer from a portion of the selected region of the second epitaxial layer;
 diffusing a dopant of the second conductivity type into the portion of the selected region, forming a collector contact; and
 forming a semiconductor device in the selected region of the first and second epitaxial layers.

19. The method of claim 18, further comprising after the step of implanting a faster-diffusing dopant:
 diffusing the faster-diffusing dopant.

20. The method of claim 18, wherein the faster-diffusing dopant is phosphorus.

21. The method of claim 18, further comprising after the step of diffusing the first dopant into the selected region of the first epitaxial layer the step of:
 forming sidewalls on the first oxide layer surrounding the selected region.

22. The method of claim 18, further comprising after the step of diffusing the first dopant into the selected region of the first epitaxial layer the step of:
 masking portions of the selected region.

23. The method of claim 18, wherein the first oxide layer is removed from a plurality of selected regions of the first epitaxial layer, further comprising the step of:
 forming a masking layer over one of the selected regions.

24. A method of manufacturing a semiconductor device, comprising the steps of:

doping a region of a semiconductor substrate of a first conductivity type with a dopant of a second conductivity type;

doping the region of the semiconductor substrate with a faster-diffusing dopant of the second conductivity type;

forming a epitaxial layer of the first conductivity type over the semiconductor substrate;

doping a region of the epitaxial layer with a dopant of the second conductivity type, the region of the epitaxial layer being in alignment with the region of the semiconductor substrate; and diffusing the dopants so that the doped region and the epitaxial layer comes into electrical contact with the doped region of the semiconductor substrate.

* * * * *